United States Patent
Bae et al.

(10) Patent No.: US 8,859,385 B1
(45) Date of Patent: Oct. 14, 2014

(54) METHOD OF FABRICATING SEMICONDUCTOR DEVICE

(71) Applicant: SK hynix Inc., Gyeonggi-do (KR)

(72) Inventors: Joo Hyung Bae, Gyeonggi-do (KR);
Kang Sik Choi, Gyeonggi-do (KR);
Jung Won Seo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/076,826

(22) Filed: Nov. 11, 2013

(30) Foreign Application Priority Data

Aug. 20, 2013 (KR) ........................ 10-2013-0098624

(51) Int. Cl.
*H01L 21/20* (2006.01)
*H01L 45/00* (2006.01)

(52) U.S. Cl.
CPC ................................ *H01L 45/1608* (2013.01)
USPC ....................................................... 438/381

(58) Field of Classification Search
USPC ................................................. 438/381, 382
See application file for complete search history.

(56) References Cited

U.S. PATENT DOCUMENTS

| 2010/0051893 | A1* | 3/2010 | Kim et al. .......................... 257/2 |
| 2013/0242648 | A1* | 9/2013 | BrightSky et al. ............. 365/163 |
| 2013/0285000 | A1* | 10/2013 | Arai .................................. 257/3 |

FOREIGN PATENT DOCUMENTS

| KR | 100640002 | 11/2006 |
| KR | 1020100026413 | 3/2010 |

* cited by examiner

*Primary Examiner* — Bradley K Smith
(74) *Attorney, Agent, or Firm* — IP & T Group LLP (57) ABSTRACT

A method of fabricating a semiconductor device includes providing a semiconductor substrate in which a lower structure is formed, forming a phase-change material layer of a first state over the lower structure, transforming an upper region of the phase-change material layer of the first state into a phase-change material layer of a second state having an etch selectivity different from the phase-change material layer of the first state, removing the phase-change material layer of the second state, and forming an upper electrode over the phase-change material layer of the first state in which the phase-change material layer of the second state is removed.

8 Claims, 7 Drawing Sheets

METHOD OF FABRICATING SEMICONDUCTOR DEVICE

CROSS-REFERENCES TO RELATED APPLICATION

This application claims priority under 35 U.S.C. 119(a) to Korean application No. 10-2013-0098624, filed on Aug. 20, 2013, in the Korean intellectual property Office, which is incorporated by reference in its entirety as set forth in full.

BACKGROUND

1. Technical Field

Various embodiments of the inventive concept relate to a method of fabricating a semiconductor device, and more particularly, to a method of fabricating a phase-change random access memory device (PCRAM).

2. Related Art

As an integration degree of semiconductor devices is increased, a channel length of a transistor is increasingly reduced.

With the rapid development of mobile and digital information communication and consumer-electronic industry, studies on existing electronic charge controlled-devices are expected to encounter the limitation. Thus, new functional memory devices of the new concept other than the existing electronic charge devices need to be developed. In particular, next-generation memory devices with large capacity, ultra-high speed, and ultra-low power need to be developed to satisfy demands on large capacity of memories in main information apparatuses.

Currently, variable resistive memory devices using a resistance device as a memory medium have been suggested as the next-generation memory devices, and phase-change random access memories (PCRAMs), resistive RAMs (ReRAMs), and magentoresistive RAMs (MRAMs) are typically used as the variable resistive memory devices.

The variable resistive memory devices may be basically configured of a switching device and a resistance device and store data "0" or "1" according to a state of the resistance device.

In particular, the PCRAMs may include a phase-change material having a characteristic switched between different resistance states through stabilization to any one of a crystalline state and an amorphous state by a heat. The phase-change material may be a chalcogenide-based material such as germanium-antimony-tellurium (Ge—Sb—Te: GST).

The phase-change material has a volatile characteristic, and thus when the phase-change material is exposed, the phase-change material may be lost through the exposed portion.

In the related art, when a phase-change material layer is etched back, and then an upper electrode is formed, the phase-change material layer is left on sidewalls of a hole since the etching process is not smoothly performed on the phase-change material layer. The phase-change material layer may be lost due to the left portion of the phase-change material layer on the sidewalls of the hole.

Therefore, there is a need for a method of preventing a phase-change material from being lost in recent semiconductor devices.

SUMMARY

One or more exemplary embodiments are provided to a method of fabricating a semiconductor device capable of preventing a phase-change material from being lost.

According to an embodiment, there is provided a method of fabricating a semiconductor device. The method may include providing a semiconductor substrate in which a lower structure is formed, forming a phase-change material layer of a first state over the lower structure, transforming an upper region of the phase-change material layer of the first state into a phase-change material layer of a second state having an etch selectivity different from the phase-change material layer of the first state, removing the phase-change material layer of the second state, and forming an upper electrode over the phase-change material layer of the first state in which the phase-change material layer of the second state is removed.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Embodiments of the inventive concept are described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these exemplary embodiments without departing from the principles and spirit of the inventive concept.

FIGS. 1 to 13 are cross-sectional views illustrating a method of fabricating a semiconductor device according to an exemplary embodiment of the inventive concept.

Figure 1:
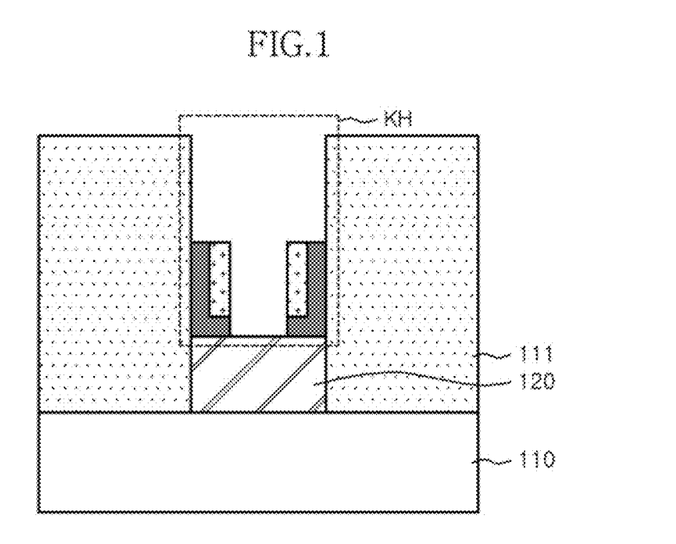
FIGS. 1 to 13 are cross-sectional views illustrating a method of fabricating a semiconductor device according to an exemplary embodiment of the inventive concept.

Referring to FIG. 1, an interlayer insulating layer 111 is formed on a semiconductor substrate 110 in which a lower structure including a word line (not shown) and a switching device (not shown) is formed, a key hole structure KH is formed in the interlayer insulating layer 111, and a heating electrode 120 is formed in the key hole structure KH. A method of forming the key hole structure KH will be described with FIGS. 7-13.

Figure 2:
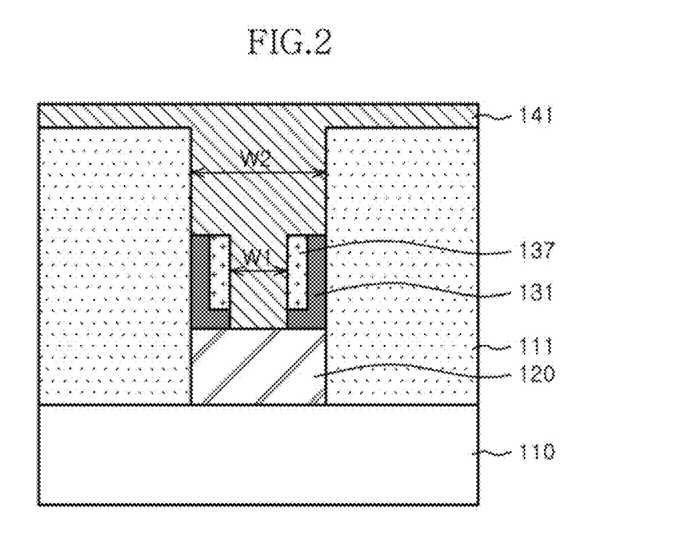

Referring to FIG. 2, a phase-change material layer 141 including a pre-phase-change material layer is formed in the key hole structure KH. The phase-change material layer 141 may be an amorphous state.

A first width W1 of a lower part of the phase-change material layer 141, which is in contact with the heating electrode 120, is smaller than a second upper width W2 of an upper part of the phase-change material layer, which is in contact with an upper electrode (see 150 of FIG. 6) as illustrated in FIG. 2. As described above, since a contact area of the phase-change material layer 141 with the heating electrode 120 is smaller, a reset current may be considerably reduced.

Figure 3:
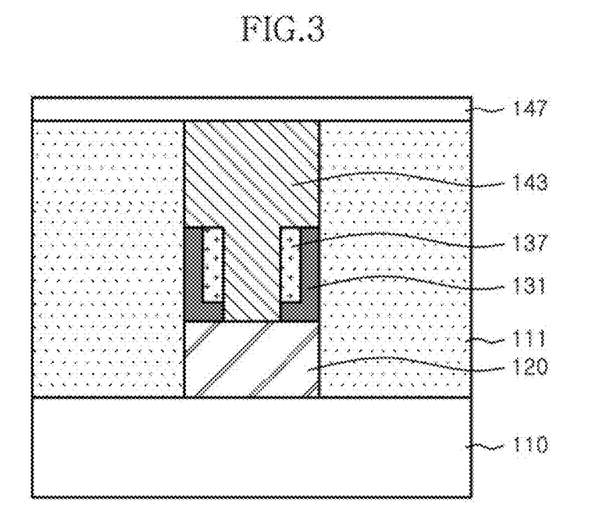

Referring to FIG. 3, the phase-change material layer of an amorphous state (see 141 of FIG. 2) is removed by an etch back process until a top surface of the interlayer insulating layer 111 is exposed, and a capping layer 147 is formed on the interlayer insulating layer 111 and the phase-change material layer 141. The capping layer 147 may be a nitride layer, and may have a thickness ranging from about 120 to about 220 Å.

Subsequently, the phase-change material layer 141 of the amorphous state is transformed into a phase-change material layer 143 of a crystalline state, that is, a phase-change material layer of a first state, by an annealing process. Here, the annealing process may be performed by a process of baking the phase-change material layer of the amorphous state with extreme ultraviolet (EUV) at a temperature ranging from about 300 to about 400° C. for about 25 to 35 minutes.

Figure 4:
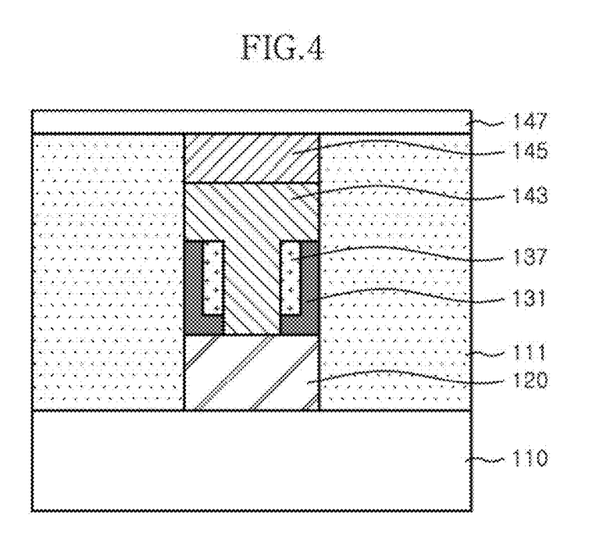

Referring to FIG. 4, impurities are implanted into an upper region of the phase-change material layer 143 of the crystalline state. For example, the impurities may be carbon (C) or silicon (Si).

The upper region of the phase-change material layer 143 of the crystalline state into which the impurities are implanted is transformed into a phase-change material layer 145 of an amorphous state, that is, a phase-change material layer of a second state. At this time, the upper region of the phase-change material layer in which the crystalline state is transformed into the amorphous state is defined through adjustment in a dose of the implanted impurities.

Figure 5:
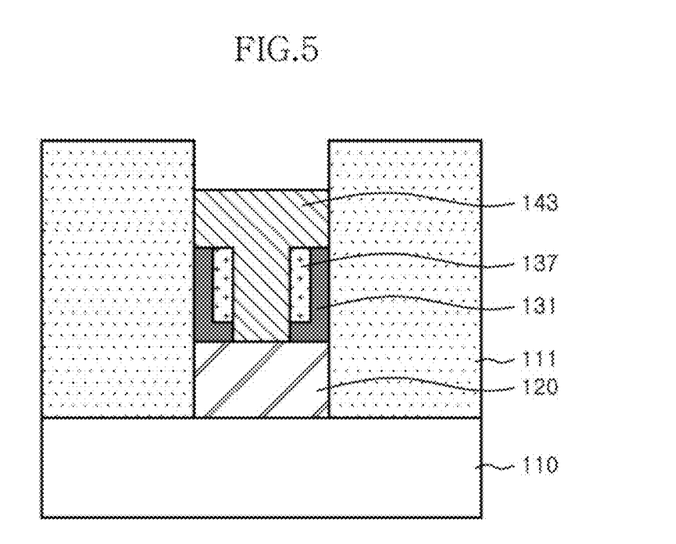

Referring to FIG. 5, the capping layer 147 and the phase-change material layer 145 of the amorphous state are removed. At this time, the phase-change material layer 145 of the amorphous state has an etch selectivity different from the phase-change material layer 143 of the crystalline state, and thus only the phase-change material layer 145 of the amorphous state may be selectively removed.

Figure 6:
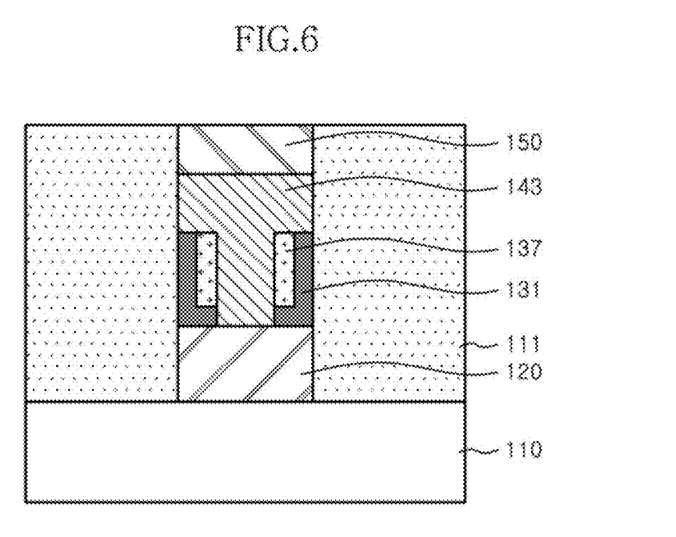

Referring to FIG. 6, a conductive material is buried in an upper electrode formation region formed by selectively removing the phase-change material layer 145 of the amorphous state to form the upper electrode 150.

The example in which the pre-phase-change material layer and the phase-change material layer of the second state are an amorphous state, and the phase-change material layer of the first state is a crystalline state has been described. However, in alternative embodiment, the pre-phase-change material layer and the phase-change material layer of the second state may be a crystalline state, and the phase-change material layer of the first state may be an amorphous state.

Hereinafter, a method of forming the phase-change material layer to reduce a reset current will be described with FIGS. 7-12.

Figure 7:
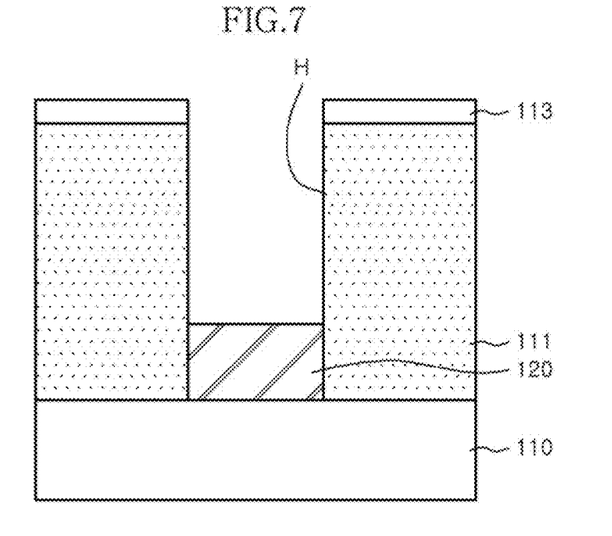

Referring to FIG. 7, an interlayer insulating layer and a buffer layer are sequentially formed on the semiconductor substrate 110 in which the word line (not shown) and the switching device (not shown) are formed, and the interlayer insulating layer and the buffer layer are etched to form a hole H exposing a predetermined portion of the semiconductor substrate 110. (Hereinafter, the etched interlayer insulating layer and the etched buffer layer are referred to as an interlayer insulating layer 111 and a buffer layer 113, respectively.) The heating electrode 120 is formed in a lower portion of the hole H. Here, the interlayer insulating layer 111 may be formed of oxide, and the buffer layer 113 may be formed of nitride.

Figure 8:
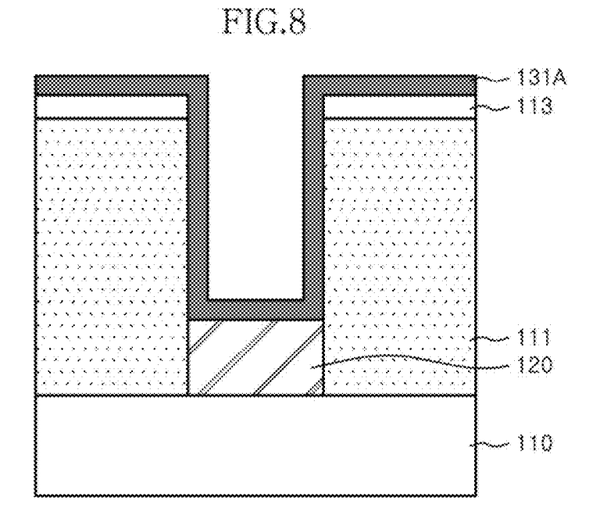

Referring to FIG. 8, a liner insulating layer 131A is formed over the entire surface of the resultant structure including the heating electrode 120 in the hole H without filling the hole H. Here, the liner insulating layer 131A may be formed using the same material as the buffer layer 113 or a material similar to the buffer layer 113.

Figure 9:
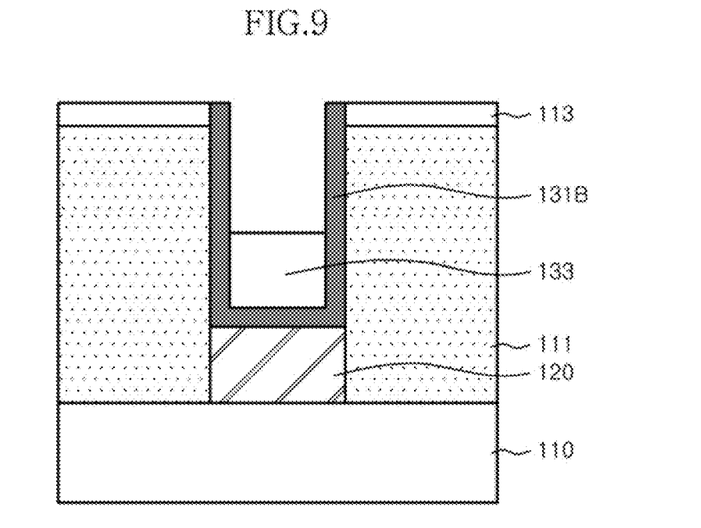

Referring to FIG. 9, a first insulating layer is formed on the liner insulating layer (see 131A of FIG. 8) to fill the hole H, and the first insulating layer and the liner insulating layer 131A are planarized and recessed until a top surface of the buffer layer 113 is exposed. As a result, a liner insulating layer 131B is formed along an inner surface of the hole H over the heating electrode 120, and a first insulating layer 133 having a predetermined height is formed over the liner insulating layer 131B in a middle portion of the hole H.

Here, the first insulating layer 133 may be formed of a material having an etch property different from the buffer layer 113 and the liner insulating layer 131B. For example, the first insulating layer 133 may include spin on dielectric (SOD).

Figure 10:
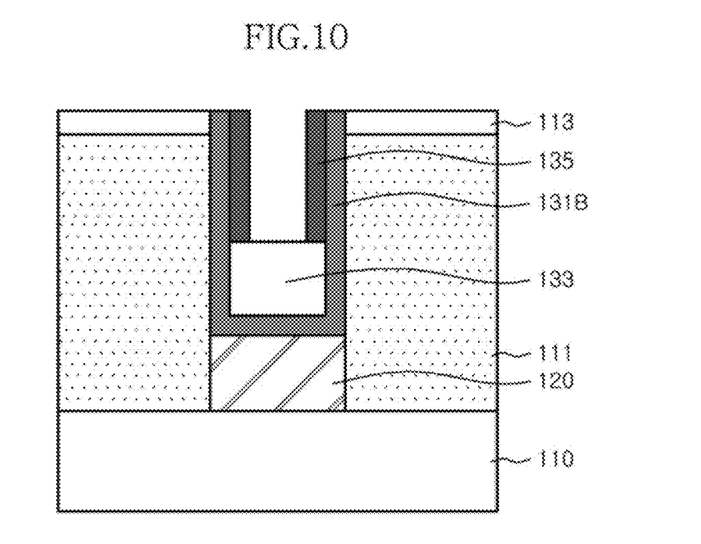

Referring to FIG. 10, a spacer insulating layer is formed over the entire surface of the resultant structure including the first insulating layer 133, and the spacer insulating layer is etched until the top surface of the buffer layer 113 is exposed to form a spacer 135 on sidewalls of the liner insulating layer 131B over the first insulating layer 133 in an upper portion of the hole H.

Figure 11:
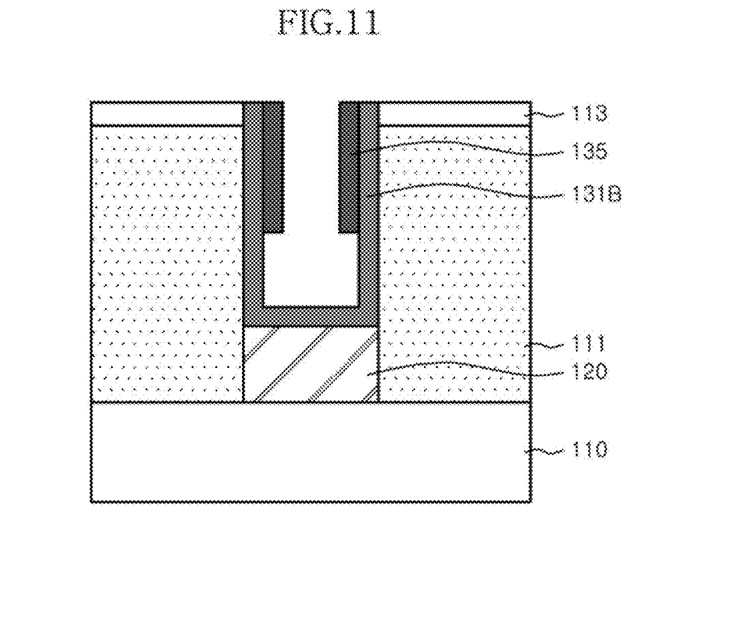

Referring to FIG. 11, the first insulating layer 133 is removed.

Figure 12:
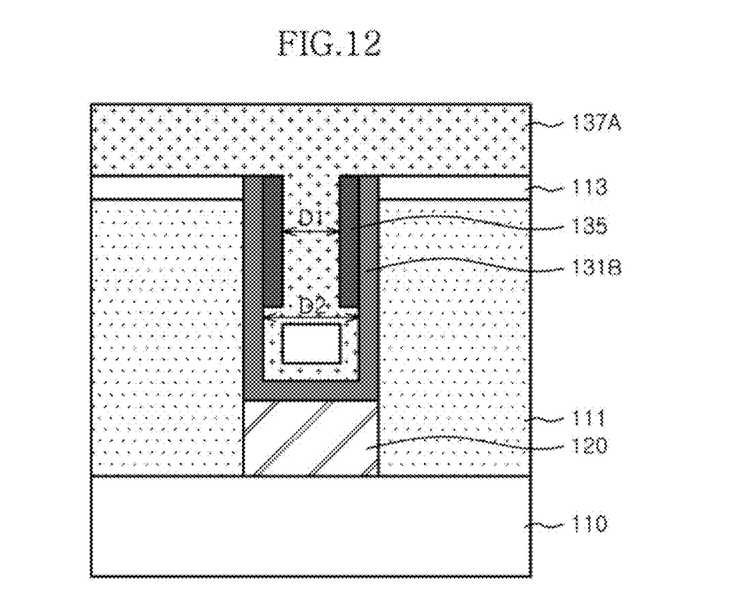
Figure 13:
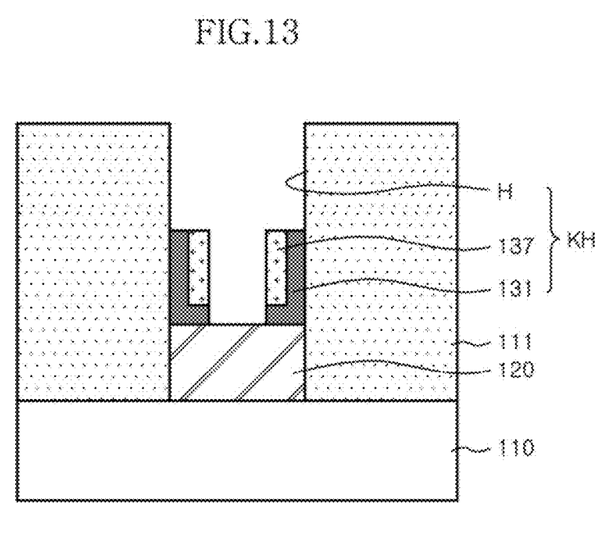

Referring to FIG. 12, a second insulating layer 137A is formed on the resultant structure including the spacer 135. Since the second insulating layer 137A is formed in the hole H having a form in which an upper diameter D1 is narrower than a lower diameter D2, the second insulating layer 137A is buried in a form having a void in the middle portion of the hole H. The second insulating layer 137A may be formed using a material having the same etch property as the buffer layer 113 and the liner insulating layer 131B, or a material having a similar etch property to the buffer layer 113 and the liner insulating layer 131B. Therefore, by removing the second insulating layer 137A as an etch target by an etching process, a key hole structure KH including a liner insulating layer 131 and a second insulating layer 137 in the hole H may be obtained as illustrated in FIG. 13.

As specifically described above, according to the exemplary embodiment of the inventive concept, impurities are implanted into an upper region of a phase-change material layer to transform the phase-change material layer into a phase-change material layer of a phase having a different etch selectivity, and thus only the phase-change material layer having the different etch selectivity may be smoothly removed in an etch back process on the phase-change material layer.

Therefore, in the exemplary embodiment of the inventive concept, since only the upper portion of the phase-change material layer may be removed using the different etch selectivity in the etch back process on the phase-change material layer, the phase-change material layer may be prevented from being exposed. Accordingly, loss of the phase-change material layer may be minimized/reduced by preventing the phase-change material layer from being exposed.

The exemplary embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of fabricating a semiconductor device, the method comprising:

providing a semiconductor substrate in which a lower structure is formed;

forming a phase-change material layer of a first state over the lower structure;

transforming an upper region of the phase-change material layer of the first state into a phase-change material layer of a second state having an etch selectivity different from the phase-change material layer of the first state;

removing the phase-change material layer of the second state; and forming an upper electrode over the phase-change material layer of the first state in which the phase-change material layer of the second state is removed.

2. The method of claim 1, wherein the first state is a crystalline state, and the second state is an amorphous state.

3. The method of claim 1, wherein the first state is an amorphous state, and the second state is a crystalline state.

4. The method of claim 1, wherein the transforming an upper region of the phase-change material layer of the first state into the phase-change material layer of the second state includes implanting impurities into the phase-change material layer of the first state.

5. The method of claim 4, wherein a depth of the phase-change material layer of the second state is controlled by a dose of the impurities.

6. The method of claim 1, before forming the phase-change material layer of the first state, further comprising:

forming a hole exposing a surface of the semiconductor substrate;

forming a heating electrode in a lower portion of the hole.

7. The method of claim 6, wherein the forming a first phase-change material layer of a first state includes:

burying a pre-phase-change material layer over the heating electrode in the hole;

forming a capping layer over a resultant structure including the pre-phase-change material layer; and annealing the pre-phase-change material layer to be transformed into the phase-change material layer of the first state.

8. The method of claim 7, wherein the pre-phase-change material layer has a structure in which a first width of a lower part of the pre-phase-change material layer in contact with the heating electrode is smaller than a second width of an upper part of the pre-phase-change material layer.

* * * * *